United States Patent [19]

Heavens et al.

[11] Patent Number: 4,810,339

[45] Date of Patent: Mar. 7, 1989

[54] PREPARING SUPERCONDUCTING CERAMIC MATERIALS

[75] Inventors: Stephen N. Heavens; Ivor W. Jones, both of Chester, England

[73] Assignee: Chloride Silent Power Limited, Cheshire, England

[21] Appl. No.: 219,403

[22] Filed: Jul. 15, 1988

[30] Foreign Application Priority Data

Jul. 22, 1987 [GB] United Kingdom ............... 8717360

[51] Int. Cl.$^4$ ............................................. C25D 13/00
[52] U.S. Cl. ............................ 204/180.1; 204/181.4; 174/126.2
[58] Field of Search ...................... 204/180.1, 181.4; 174/126.2

[56] References Cited

U.S. PATENT DOCUMENTS 4,079,192 3/1978 Josse ................................. 174/126.2

Primary Examiner—R. L. Andrews
Attorney, Agent, or Firm—Finnegan, Henderson, Farabow, Garrett & Dunner

[57] ABSTRACT

Superconducting ceramic material is prepared by mixing desired oxide powders, calcining them, forming a slurry of the calcined powders with a carrier liquid, depositing a layer of the ceramic from the slurry by electrophoretic deposition and then drying the layer. The layer should then be sintered to increase densification. Typical powders are oxides of Y, Ba and Cu in molar proportions 1:2:3 respectively.

20 Claims, No Drawings

PREPARING SUPERCONDUCTING CERAMIC MATERIALS

BACKGROUND OF THE INVENTION

The present invention is concerned with the preparation of superconducting ceramic materials.

It has been shown quite recently that certain ceramic materials can exhibit superconductive properties at relatively high temperatures, e.g. above the boiling point of nitrogen. In particular, ceramic materials synthesized from yttrium, barium and copper oxides in the molar proportions 1:2:3 have exhibited superconductivity at such high temperatures.

Hitherto the ceramics have been made by dry mixing the oxides, calcining, pressing into a pellet and then sintering to form a ceramic body. However, although such ceramic bodies can indeed exhibit the sought after superconductive properties, they do not constitute a convenient structure or shape for making practical use of the superconductive properties so derived.

SUMMARY OF THE INVENTION

The present invention essentially proposes to form superconducting ceramic materials making use of the process of electrophoretic deposition (EPD).

EPD is a complex physical/chemical process and it cannot be predicted in advance whether any particular suspension of particles in a liquid medium will acquire a significant surface charge for any substantial deposition to take place, what the sign of the charge if any will be, or indeed whether any deposition will take place even if charging of the particles does occur. It is therefore by no means obvious that any material can be deposited electrophoretically. Oxides, for example alumina, do tend to acquire a surface positive charge by hydrogen bonding with environmental moisture. However, any attempt to deposit alumina electrophoretically will generally result in negligible or weak deposits that are unstable and full of gas bubbles.

It is surprising therefore that the electrophoretic deposition of superconducting ceramic materials produces highly satisfactory deposits which exhibit the expected superconductivity.

Accordingly the present invention comprises a method of preparing a superconducting ceramic material comprising the steps of mixing together predetermined proportions of selected oxide powders, calcining the mixed powders to produce a ceramic powder having a desired phase for superconductivity, and forming the powder as a ceramic mass, wherein the forming step comprises preparing a slurry containing the ceramic powder suspended in a carrier liquid, depositing a layer of the ceramic from the slurry by electrophoretic deposition and then drying the deposited ceramic layer to drive off the carrier liquid to form the ceramic mass.

Preferably the method includes the additional step of sintering the ceramic mass to increase its densification.

It may also be desirable for the carrier liquid to be non aqueous, particularly amyl alcohol.

The ceramic powder may be dry milled prior to use in preparing the slurry and this milling may continue for at least two hours. The slurry itself may additionally be milled for at least five hours prior to use in the electrophoretic depostion.

The electrophoretic deposition is conducted by applying an electric field between mutually positive and negative electrodes immersed in the slurry, and importantly this may be done with the electrode on which deposition is to take place being the negative electrode. It has been discovered that the ceramic superconductive powders become positively charged in EPD processes resulting in a strong adherent deposit forming on the negative electrode. Another ceramic material which is known to be successfully deposited by EPD is beta" alumina. For beta alumina, sodium cations become dissociated from the weakly bound conduction planes during the milling process, leaving particles which are negatively charged so that EPD of beta" alumina produces good quality deposits, but on the positive electrode.

In preferred examples of the present invention the EPD layer may be deposited on nickel. Nickel has been found particularly convenient since the nickel substrate with deposited layer may subsequently be sintered to densify the layer and without apparently causing degrading oxidation or chemical reaction of the layer.

Conveniently, the layer may be deposited as a thin coating adhering to a metal substrate. Such a product may have particular value in applications of the superconductive material since the thin coating may have the necessary flexibility normally lacking in ceramics, with the metal substrate providing the necessary tensile strength. Such coatings may be between 30 to 150 microns thick.

Examples of the present invention will now be described in further detail.

DETAILED DESCRIPTION OF THE EXAMPLES

EXAMPLE 1

A ceramic powder was prepared by mixing oxides of yttrium, barium and copper in molar proportions 1:2:3 (using raw materials yttrium oxide, barium hydroxide hydrate and cupric oxide). The mixture of powders was fired at 950° C. for nine hours. In an attempt to produce a powder that would acquire a negative charge on milling, the powders were fired in an atmosphere of oxygen, but in the event this had no effect. The fired or calcined powder was dry milled for four hours and a sample analysed by X-ray diffraction. The powder was found to contain at least 80% of a perovskite structure that is thought to be oxygen-deficient leading to superconductivity.

The powder was then kept dry overnight in an oven at 250° C. (for a period of sixteen hours) and subsequently suspensions of the powder in amyl alcohol were prepared using 400 grams powder in 1 liter alcohol.

In some batches, a nitrocellulose/acetone mixture was added to the slurry in an attempt to increase deposition efficiency.

The suspensions or slurry were then milled for sixteen hours and then passed through an electrophoretic deposition cell containing mutually positive and negative electrodes.

Very surprisingly, it was found that in all cases the suspensions were positively charged, in spite of all attempts to render the suspension negative as mentioned above. Strong adherent deposits were successfully obtained on the negative electrode of the EPD cell. Thick deposits of up to 2 mm were obtained by depositing the suspension on stainless steel mandrels at 650 volts for 4 minutes. The deposited material was then dried. During drying the deposits tended to crack probably owing to the fine particle size, but large pieces of ceramic were successfully recovered.

Deposits were also obtained in relatively thin layers, between 30 to 150 microns, by depositing for a few seconds only on various substrates including copper, nickel, Inconel, Fecralloy and tantalum foil. These deposits did not crack on drying.

Samples of ceramic and coated foils were subsequently sintered at 950° C. for eight hours using a slow cooling profile. The average fired density of the resultant ceramic was in the region of 90% of the theoretical density. X-ray diffraction indicated that the proportions of the oxygen-deficient perovskite structure had increased to greater than or equal to 95%.

Samples were then tested for superconductivity by the Meissner effect, which is the repulsion of a superconductor in a static magnetic field. On cooling of the samples in liquid nitrogen, it was found that the specimens were indeed repelled by a magnet.

Of the samples in which the ceramic was coated on metal foil, most showed oxidation or chemical reaction. However, nickel foil proved to be a satisfactory substrate, and craze-free coatings of the Y-Ba-Cu-O ceramic of thickness up to 100 micron were successfully obtained on nickel. These foils could be flexed without the coating breaking up.

For comparison, some samples of the ceramic were also obtained by the prior art technique of die pressing the calcined powder at 9000 psi (about 62,000 kPa), and subsequently sintering. Samples made by this technique and sintered at 1000° C. for six hours had a fired density of only 85% theoretical. These samples did also demonstrate the Meissner effect.

In summary, two substantial advantages are apparent from use of the EPD process, (i) obtaining a good quality adherent uniform coating of the ceramic, and (ii) obtaining a higher density ceramic with lower sintering temperatures.

EXAMPLE 2

A ceramic powder was prepared by mixing oxides of bismuth, strontium, calcium and copper (using raw materials bismuth oxide, strontium hydroxide octahydrate, calcium carbonate and cupric oxide) in molar proportions 2:2.3:0.7:2. The mixture of powders was fired at 700° C. for 2 hours and dry milled. After checking for conversion to bismuth strontium calcium culprate by X-ray diffraction, the powder was kept dry at 125° C. A suspension of 800 g powder in 1 liter dry amyl alcohol was prepared and the suspension milled for 16 hours. Strong adherent deposits up to 1.2 mm thick were obtained on a negative electrode of the EPD cell after applying 660 V for 2 minutes.

EXAMPLE 3

A ceramic powder was prepared by mixing oxides of lanthanum, strontium and copper (using raw materials lanthanum oxide, strontium hydroxide octahydrate and cupric oxide) in molar proportions 1.8:0.2:1. The mixture of powders was fired at 925° C. for 2 hours, dry milled and fired again at 1000° C. for 2 hours. After checking for conversion to lanthanum strontium cuprate by X-ray diffraction, the powder was kept dry at 125° C. A suspension of 400 g powder in 1 liter dry amyl alcohol was prepared and the suspension milled for 16 hours. A very thin deposit, approximately 0.1 mm thick, was obtained on a negative electrode of the EPD cell after applying 660 V for 1 minute.

EXAMPLE 4

A ceramic powder was prepared by mixing oxides of lanthanum, strontium and niobium (using raw materials lanthanum oxide, strontium hydroxide octahydrate and niobium oxide) in molar proportions 2:1:5. The mixture of powders was fired at 1000° C. for 2 hours and dry milled. After checking for conversion to lanthanum strontium niobate by X-ray diffraction, the powder was kept dry at 125° C. A suspension of 600 g powder in 1 liter dry amyl alcohol was prepared and the suspension milled for 16 hours. Deposits were obtained, up to 0.6 mm thick, on a positive electrode of the EPD cell after applying 660 V for 1 minute.

What is claimed is:

1. A method of preparing a superconducting ceramic material comprising the steps of mixing together predetermined proportions of selected oxide powders, calcining the mixed powders to produce a ceramic powder having a desired phase for superconductivity, and forming the powder as a ceramic mass, wherein the forming step comprises preparing a slurry containing the ceramic powder suspended in a carrier liquid, depositing a layer of the ceramic material from the slurry by electrophoretic deposition and then drying the deposited ceramic material to drive off the carrier liquid to form the ceramic mass.

2. A method as claimed in claim 1, including the additional step of sintering the ceramic mass to increase its densification.

3. A method as claimed in claim 1, wherein the carrier liquid is non aqueous.

4. A method as claimed in claim 1, wherein the carrier liquid is amyl alcohol.

5. A method as claimed in claim 1, wherein the ceramic powder is dry milled prior to use in preparing the slurry.

6. A method as claimed in claim 5, wherein the powder is dry milled for at least two hours.

7. A method as claimed in claim 1, wherein the slurry is milled for at least five hours prior to use in electrophoretic deposition.

8. A method as claimed in claim 1, wherein the electrophoretic deposition is conducted by applying an electric field between mutually positive and negative electrodes immersed in the slurry, with the electrode on which deposition is to take place being the negative electrode.

9. A method as claimed in claim 1, wherein the layer is deposited on nickel.

10. A method as claimed in claim 1, wherein the layer is deposited as a thin coating adhering to a metal substrate.

11. A method as claimed in claim 10, wherein the coating is 30 to 150 microns thick.

12. A method as claimed in claim 1, wherein the selected oxide powders are oxides of Y, Ba and Cu.

13. A method as claimed in claim 12, wherein the oxide powders are yttrium oxide, barium hydroxide hydrate and cupric oxide.

14. A method as claimed in claim 13, wherein the powders are mixed in molar proportions 1:2:3 respectively.

15. A method as claimed in claims 1, wherein the selected oxide powders are oxides of bismuth, strontium, calcium and copper.

16. A method as claimed in claim 15, wherein the oxide powders are bismuth oxide, strontium hydroxide octahydrate, calcium carbonate and cupric oxide mixed in molar proportions 2:2.3:0.7:2 respectively.

17. A method as claimed in claims 1, wherein the selected oxide powders are oxides of lanthanum, strontium and copper.

18. A method as claimed in claim 17, wherein the oxide powders are lanthanum oxide, strontium hydroxide octahydrate and cupric oxide mixed in molar proportions 1.8:0.2:1 respectively.

19. A method as claimed in claim 1, wherein the selected oxide powders are oxides of lanthanum, strontium and niobium.

20. A method as claimed in claim 19, wherein the oxide powders are lanthanum oxide, strontium hydroxide octahydrate and niobium oxide mixed in molar proportions 2:1:5 respectively.

* * * * *